United States Patent
Arik et al.

(10) Patent No.: US 9,478,479 B2
(45) Date of Patent: Oct. 25, 2016

(54) THERMAL MANAGEMENT SYSTEM AND METHOD

(75) Inventors: Mehmet Arik, Niskayuna, NY (US); William Dwight Gerstler, Niskayuna, NY (US); Ri Li, Niskayuna, NY (US); Pradeep Chandra Babu Salapakkam, Schenectady, NY (US); Bryan Patrick Whalen, Gansevoort, NY (US)

(73) Assignee: General Electric Company, Niskayuna, NY (US)

( * ) Notice: Subject to any disclaimer, the term of this patent is extended or adjusted under 35 U.S.C. 154(b) by 709 days.

(21) Appl. No.: 12/911,995

(22) Filed: Oct. 26, 2010

(65) Prior Publication Data
US 2012/0097377 A1    Apr. 26, 2012

(51) Int. Cl.
F28F 7/02    (2006.01)
H01L 23/467    (2006.01)
H05K 7/20    (2006.01)
H01L 23/473    (2006.01)

(52) U.S. Cl.
CPC ......... H01L 23/467 (2013.01); H05K 7/20172 (2013.01); *H01L 23/4735* (2013.01); *H01L 2924/0002* (2013.01); *Y10T 29/4935* (2015.01)

(58) Field of Classification Search
CPC ............... H01L 23/467; H01L 2924/0002; H01L 23/4735; H05K 7/20172; Y10T 29/4935
USPC ...... 165/80.2, 80.3, 80.4; 361/694, 695, 697
See application file for complete search history.

(56) References Cited

U.S. PATENT DOCUMENTS

| | | | |
|---|---|---|---|
| 2,766,619 A | 10/1956 | Tribus et al. | |
| 3,692,414 A | 9/1972 | Hosterman et al. | |
| 3,710,128 A | 1/1973 | Kubisiak | |
| 4,501,319 A * | 2/1985 | Edelman | F28F 13/02 165/84 |
| 4,583,854 A | 4/1986 | Lozar | |
| 4,736,247 A | 4/1988 | Graham et al. | |
| 4,745,290 A | 5/1988 | Frankel et al. | |
| 4,966,460 A | 10/1990 | Kahley | |
| 5,445,215 A | 8/1995 | Herbert | |
| 5,477,371 A | 12/1995 | Shafir | |
| 5,568,260 A | 10/1996 | Schneiter | |

(Continued)

FOREIGN PATENT DOCUMENTS

| | | |
|---|---|---|
| CN | 1471159 A | 1/2004 |
| DE | 218672 A1 | 2/1985 |

(Continued)

OTHER PUBLICATIONS

European Search Report, Application Serial No. 11186013.6, pp. 1-6.

(Continued)

*Primary Examiner* — Len Tran
*Assistant Examiner* — Claire Rojohn
(74) *Attorney, Agent, or Firm* — Pabitra K. Chakrabarti (57) ABSTRACT

A thermal management system is provided. The thermal management system includes at least one heat sink including one or more respective fins, wherein the one or more fins include one or more respective cavities. The thermal management system also includes a synthetic jet stack including at least one synthetic jet mounted within each of the respective cavities employing at least one engaging structure to provide a rigid positioning of the synthetic jet stack within the fins, wherein the synthetic jet includes at least one orifice through which a fluid is ejected.

16 Claims, 7 Drawing Sheets

(56) References Cited

U.S. PATENT DOCUMENTS

| | | | |
|---|---|---|---|
| 5,570,186 A | 10/1996 | Satzger et al. | |
| 5,708,279 A | 1/1998 | Cheng | |
| 5,781,411 A | 7/1998 | Feenstra | |
| 5,846,081 A | 12/1998 | Bushway | |
| 5,940,272 A | 8/1999 | Emori et al. | |
| 6,128,188 A | 10/2000 | Hanners | |
| 6,166,904 A * | 12/2000 | Kitahara | H01L 23/427 257/E23.088 |
| 6,296,048 B1 * | 10/2001 | Sauer | H01L 21/4882 165/185 |
| 6,371,200 B1 | 4/2002 | Eaton | |
| 6,588,497 B1 * | 7/2003 | Glezer | F15D 1/009 165/84 |
| 6,666,261 B2 * | 12/2003 | Yang et al. | 165/80.4 |
| 6,788,807 B1 | 9/2004 | Norita et al. | |
| 6,817,405 B2 | 11/2004 | Kamath et al. | |
| 6,927,863 B2 | 8/2005 | Gurny | |
| 7,027,145 B2 | 4/2006 | Segall et al. | |
| 7,252,140 B2 | 8/2007 | Glezer et al. | |
| 7,269,471 B2 | 9/2007 | Kadono | |
| 7,286,347 B2 | 10/2007 | Wang et al. | |
| 7,607,470 B2 * | 10/2009 | Glezer et al. | 165/121 |
| 7,891,410 B1 * | 2/2011 | Monson | F28F 3/02 165/80.2 |
| 8,120,908 B2 | 2/2012 | Arik et al. | |
| 8,342,819 B2 | 1/2013 | Arik et al. | |
| 8,388,142 B2 * | 3/2013 | Jones | F21V 29/02 165/104.11 |
| 8,584,735 B2 * | 11/2013 | Gerlach | F28D 1/05333 165/120 |
| 2002/0154396 A1 | 10/2002 | Overbeck | |
| 2003/0221814 A1 * | 12/2003 | Kamath et al. | 165/80.3 |
| 2004/0190305 A1 * | 9/2004 | Arik et al. | 362/555 |
| 2004/0263863 A1 | 12/2004 | Rogers et al. | |
| 2006/0021736 A1 | 2/2006 | Tran | |
| 2006/0042782 A1 | 3/2006 | Chen | |
| 2007/0029069 A1 * | 2/2007 | Duan | 165/80.4 |
| 2007/0124015 A1 | 5/2007 | Chen et al. | |
| 2008/0148590 A1 | 6/2008 | Hayashi et al. | |
| 2009/0145581 A1 | 6/2009 | Hoffman et al. | |
| 2009/0321046 A1 | 12/2009 | Hernon et al. | |
| 2010/0014251 A1 | 1/2010 | Refai-Ahmed | |
| 2010/0038056 A1 | 2/2010 | Ellsworth et al. | |
| 2010/0110630 A1 | 5/2010 | Arik et al. | |
| 2010/0110635 A1 | 5/2010 | Jones et al. | |
| 2010/0258270 A1 * | 10/2010 | Arik | H01L 23/467 165/80.3 |
| 2011/0024092 A1 | 2/2011 | Gerlach | |
| 2011/0139429 A1 * | 6/2011 | Salapakkam | H01L 23/467 165/185 |

FOREIGN PATENT DOCUMENTS

| | | |
|---|---|---|
| DE | 9110287 U1 | 10/1991 |
| EP | 0385090 A1 | 9/1990 |
| EP | 1580521 A2 | 9/2005 |
| EP | 1797992 A1 | 6/2007 |
| EP | 2239775 A2 | 10/2010 |
| JP | 09139448 A | 5/1997 |
| JP | 1051912 A | 2/1998 |
| JP | 2001332671 A | 11/2001 |
| JP | 2002026214 A | 1/2002 |
| JP | 2008196989 A | 8/2008 |
| JP | 2011103395 A | 5/2011 |

OTHER PUBLICATIONS

Salapakkam et al., "Augmenting Forced Convection Heat Transfer Coupled with An Aerodynamic Surface and A Synthetic Jet", ITHERM 2010, Las Vegas, NV US, Jun. 2-5, 2010.

Unofficial English Translation of Chinese Office Action issued in connection with corresponding CN Application No. 201110354647.0 on Mar. 31, 2015.

Unofficial English Translation of Japanese Office Action issued in connection with corresponding JP Application No. 2011230218 on Mar. 3, 2015.

Dalgleish et al., "Laser-Based Inspection of Cutting Tools for Advanced Manufacturing Systems", Factory 2000—Advanced Factory Automation, Conference Publication No. 398, IEE 1994, pp. 502-508, Oct. 3-5, 1994.

Li et al., "Machine-Vision-Based Surface Finish Inspection for Cutting Tool Replacement in Production", Int. J. Prod. Res., vol. 42, No. 11, pp. 2279-2287, Jun. 1, 2004.

Yan et al., "Extraction and Optimisation of Cutting Conditions for 2½-Axis Milling", The International Journal of Advanced Manufacturing Technology, vol. 16, pp. 695-699, 2000.

Utturkar et al., "Assessment of Cooling Enhancement of Synthetic Jet in Conjunction with Forced Convection", ASME International Mechanical Engineering Congress and Exposition, pp. 1-5, Nov. 11-15, 2007, Seattle, WA.

Mahalingam et al., "Thermal Management Using Synthetic Jet Ejectors", IEEE Transactions on Components and Packaging Technologies, vol. 27, No. 3, pp. 439-444, Sep. 2004.

Mahalingam et al., "Design and Thermal Characteristics of a Synthetic Jet Ejector Heat Sink", Transactions of the ASME, Journal of Electronic Packaging, vol. 127, pp. 172-177, Jun. 2005.

Arik et al., "Interaction of a Synthetic Jet With an Actively Cooled Heat Sink", IEEE, 2008, pp. 374-379.

* cited by examiner

THERMAL MANAGEMENT SYSTEM AND METHOD

BACKGROUND

The invention relates generally to thermal management systems, and more particularly, to systems and methods for packaging synthetic jets.

As the size of semiconductor devices has continued to shrink and circuit densities have increased accordingly, thermal management of these devices has become more challenging. In the past, thermal management in semiconductor devices was often addressed through the use of forced convective air cooling, either alone or in conjunction with various heat sink devices, and was accomplished through the use of fans. However, fan-based cooling systems are undesirable due to the noise attendant to their use. Moreover, the use of fans requires relatively large moving parts, and correspondingly high power inputs, in order to achieve the desired level of heat transfer. As a result of the moving parts, fan reliability is also an issue Furthermore, while fans are adequate for providing global movement of air over electronic devices, they generally provide insufficient localized cooling to provide adequate heat dissipation for the hot spots that typically exist in semiconductor devices and in many types of electronic equipment.

More recently, thermal management systems have been developed which utilize synthetic jets. Such systems are more energy efficient than comparable fan-based systems, and also offer reduced levels of noise and electromagnetic interference. The use of synthetic jets has proven very efficient in providing localized heat dissipation, and hence can be used to address hot spots in semiconductor devices and electronic equipment. Synthetic jets may be used in conjunction with fan-based systems to provide thermal management systems that afford both global and localized heat dissipation.

Despite their notable advantages, however, there is a need in the art for further improvements in synthetic jet ejectors. In particular, synthetic jets need to be packaged in fins that provide reduced thermal resistance and steer fluid flow in the jet, for optimal performance. However, such packaging is complex.

Therefore, there is a need in the art for an optimally packaged thermal management system.

BRIEF DESCRIPTION

In accordance with an embodiment of the invention, a thermal management system is provided. The thermal management system includes at least one heat sink including one or more respective fins, wherein the one or more fins include one or more respective cavities. The thermal management system also includes a synthetic jet stack including at least one synthetic jet mounted within each of the respective cavities employing at least one engaging structure to provide a rigid positioning of the synthetic jet stack within the fins, wherein the synthetic jet includes at least one orifice through which a fluid is ejected.

In accordance with another embodiment of the invention, a method for manufacturing a thermal management system is provided. The method includes disposing at least one heat sink comprising one or more respective fins, each of the fins including one or more respective cavities. The method also includes mounting a synthetic jet stack including at least one synthetic jet within each of the respective cavities, employing at least one engaging structure to provide a rigid positioning of the synthetic jet stack within the fins, wherein the synthetic jet includes at least one orifice through which a fluid is ejected.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the invention include systems and methods for packaging synthetic jet embedded fins. The systems and methods include various techniques of mechanically coupling the synthetic fin within the fins to provide high performance cooling. Although embodiments illustrated below include one synthetic jet attached to a single fin, it should be noted that the techniques are applicable to multiple synthetic jets attached to multiple fins and heat sinks.

Figure 1:
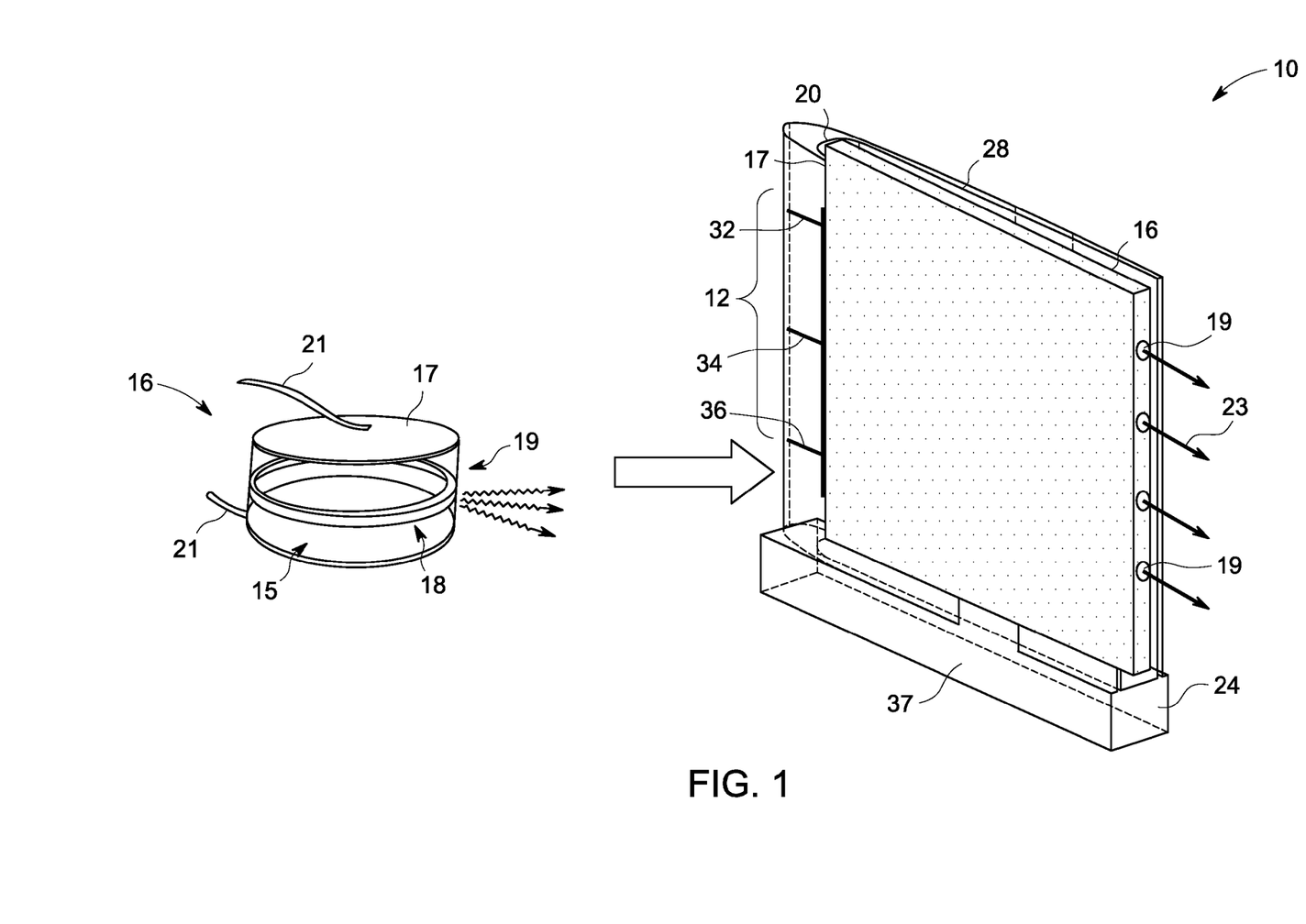
FIG. 1 is a cross-sectional view of an exemplary synthetic jet thermal management system including a wire frame in accordance with an embodiment of the invention.

FIG. 1 is a cross-sectional view of a thermal management system 10 including a wire frame 12. A synthetic jet 16 is mounted within a cavity 20 in a heat sink 24 including one or more respective fins 28. The synthetic jet 16 includes two piezo disks 15, 17 with an elastomeric wall 18 between them. In an example, the elastomeric wall is made of silicone material. The elastomeric wall 18 includes at least one orifice 19 for fluid flow. Electrical wires 21 attached to the piezo disk 17 ensure electrical connection to the synthetic jet 16.

In the illustrated embodiment, the synthetic jet 16 is inserted into the fin 28 via the wire frame 12. For example, the wire frame or array of wires includes three wires 32, 34, 36 attached to the synthetic jet through holes (not shown) on the fin 28. Non-limiting example of material used in the wires 32, 34, and 36 are copper and aluminum. In another example, the fin is made of aluminum. The synthetic jet 16 also includes multiple orifices 19 through which a fluid 23 is ejected. In one embodiment, the fluid is air. To increase robustness, a slot at a base center 37 of the fin 28 may be opened and a similar wire frame 12 may be employed therein. It will be appreciated that although one heat sink, one fin and synthetic jet is illustrated herein, there may be any number of heat sinks, fins and synthetic jets employed.

Figure 2:
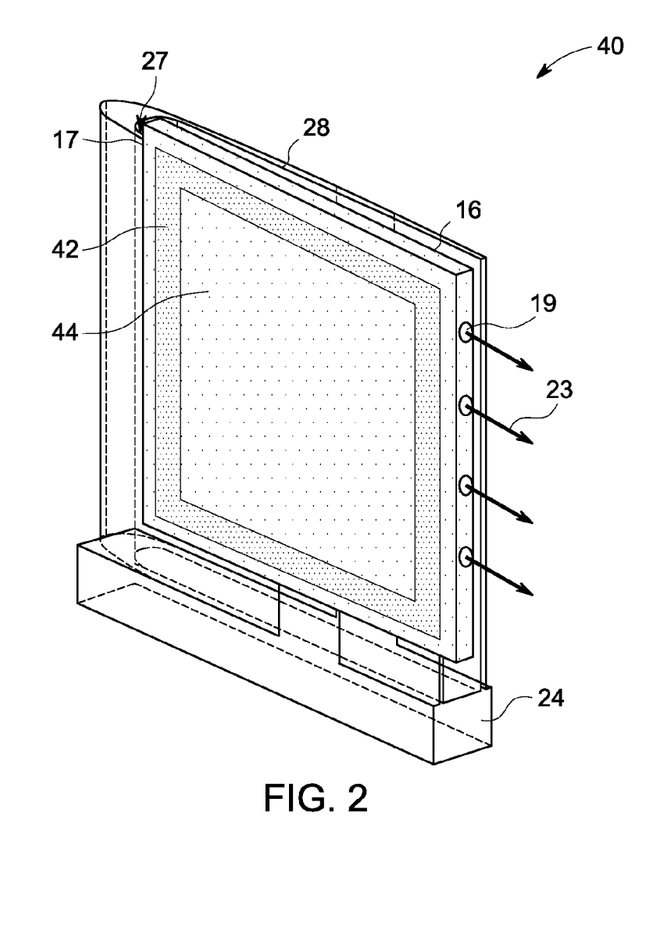
FIG. 2 is a cross-sectional view of an exemplary synthetic jet thermal management system including a gasket in accordance with an embodiment of the invention.

FIG. 2 is a cross-sectional view of a thermal management system 40 including a gasket 42. The gasket 42 is disposed between an outer surface 44 of the piezo disk 17 (FIG. 1) and an inner surface 27 of the fin 28. It should be pointed out that while the piezo disk 17 shown in FIG. 1 is round, it can be any planar shape, including square, as shown in FIG. 2. The outer surface 44 of the piezo disk 17 bellows in and out within the fin 28. Similarly, a second gasket is adhesively coupled to the other piezo disk 15 (FIG. 1). A couple of different manufacturing techniques may be employed for the mechanical coupling of the gasket 42 with the synthetic jet 16 inserted into the fin 28. In a particular embodiment, the gasket 42 may be manufactured separately and an adhesive is applied on each side of the gasket. The gasket 42 is further attached to the jet 16 that is separately manufactured, with the adhesive on one side that would have enough tact at room temperature and the jet 16 is then inserted into the fin 28. Furthermore, heat or a chemical is applied to ensure desirable tact to the adhesive on the other side. The thickness of the gasket 42 may be selected based upon a desirable volume required for the piezo disk 17 to bellow back and forth. For example, if a desirable volume required for bellowing is 300 µm, the thickness of the gasket would be at least 300 µm to avoid collision of the jet 16 with the inner surface 27 of the fin 28. In another embodiment, the gasket 42 is built onto the piezo disk 17 during the manufacturing of the synthetic jet 16 and an adhesive is further applied on an outer gasket material. When the synthetic jet 16 is inserted into the fin 28, the adhesive is activated either via mechanical pressure, heat, or chemical activation. Subsequently the adhesive bonds the gasket 42 to the inner suface 27 of the fin. In another embodiment, the gasket is dispensed over the synthetic jet and after attachment to the fin, is curing at a specified temperature.

Figure 3:
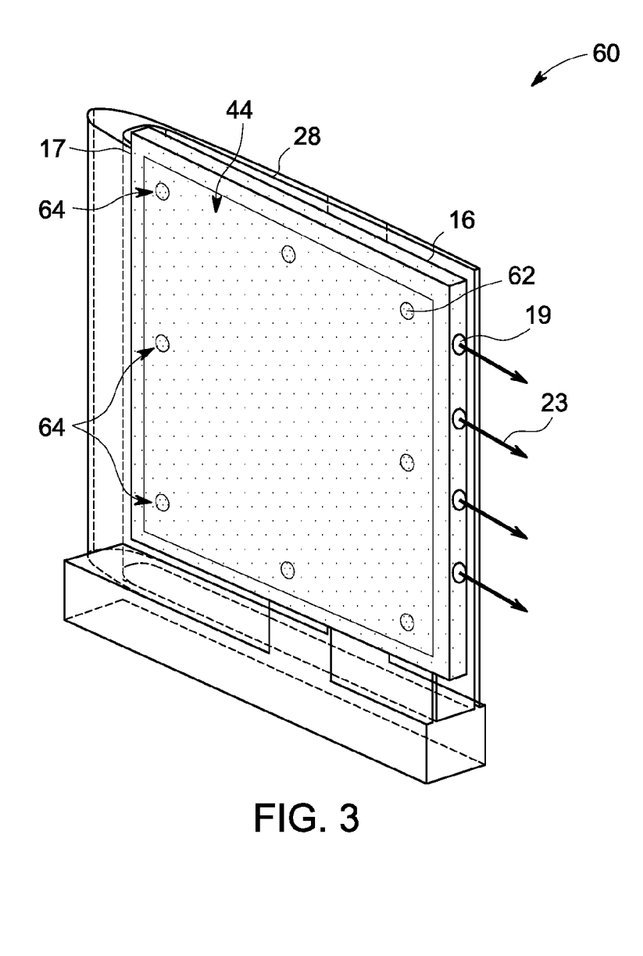
FIG. 3 is a cross-sectional view of an exemplary synthetic jet thermal management system including multiple bumps in accordance with an embodiment of the invention.

FIG. 3 is a cross-sectional view of a thermal management system 60 including multiple bumps 62. The bumps 62 are formed at different locations 64 on an outer surface 44 of the piezo disk 17 (FIG. 1) of the synthetic jet 16. Similar shaped dimples (not shown) are formed at the same locations on the inner side 27 of the fin 28 such that the bumps 62 align into respective dimples to provide desirable mechanical coupling of the synthetic jet 16 and the fin 28. In one embodiment, dimples are formed by drilling holes on the inner side 27 of the fin 28 and later filling the holes with epoxy to establish smooth bumps over the surface. In another embodiment, the bumps are formed by a stamping process via a dye. It will be appreciated that any number of dimples and bumps may be formed.

Figure 4:
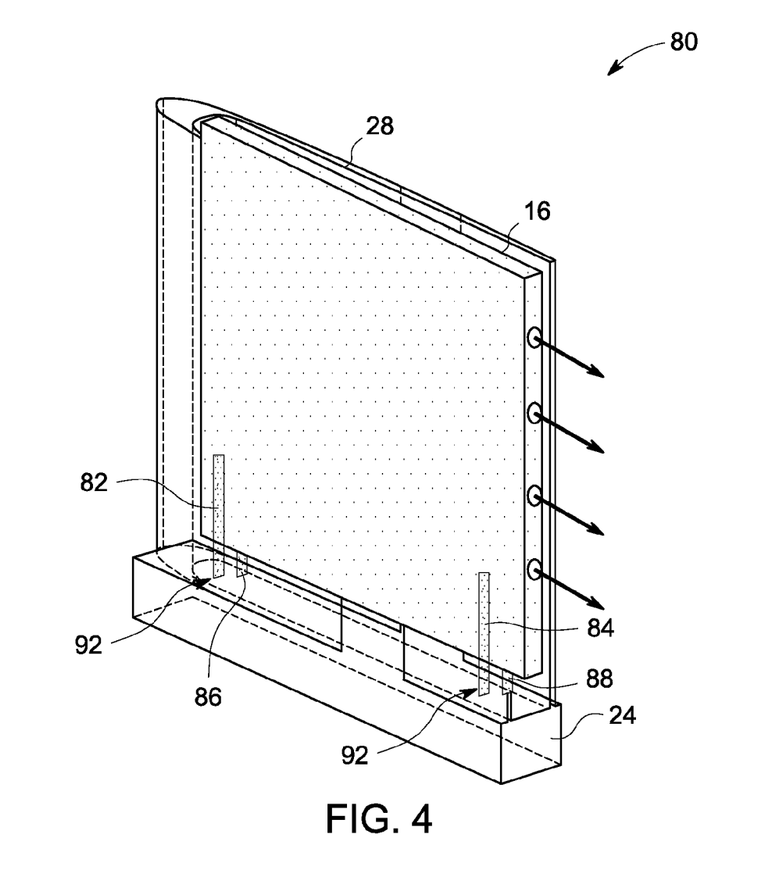
FIG. 4 a cross-sectional view of an exemplary synthetic jet thermal management system including multiple locator pins in accordance with an embodiment of the invention.

FIG. 4 is a cross-sectional view of a thermal management system 80 including multiple locator pins 82, 84, 86 and 88. The locator pins are welded or soldered on an outer surface 44 of the piezo disk 17. In the illustrated embodiment, two locator pins 82, 84 and 86, 88 are welded on each side of the piezo disk respectively. In a particular embodiment, tight fitting holes 92 are drilled in the base/heat sink 24 (FIG. 1) of the fin 28 to accept the locator pins. The locator pins ensure a tight mechanical coupling between the synthetic jet 16 and the fin 28. Again, any number of holes and locator pins may be employed.

Figure 5:
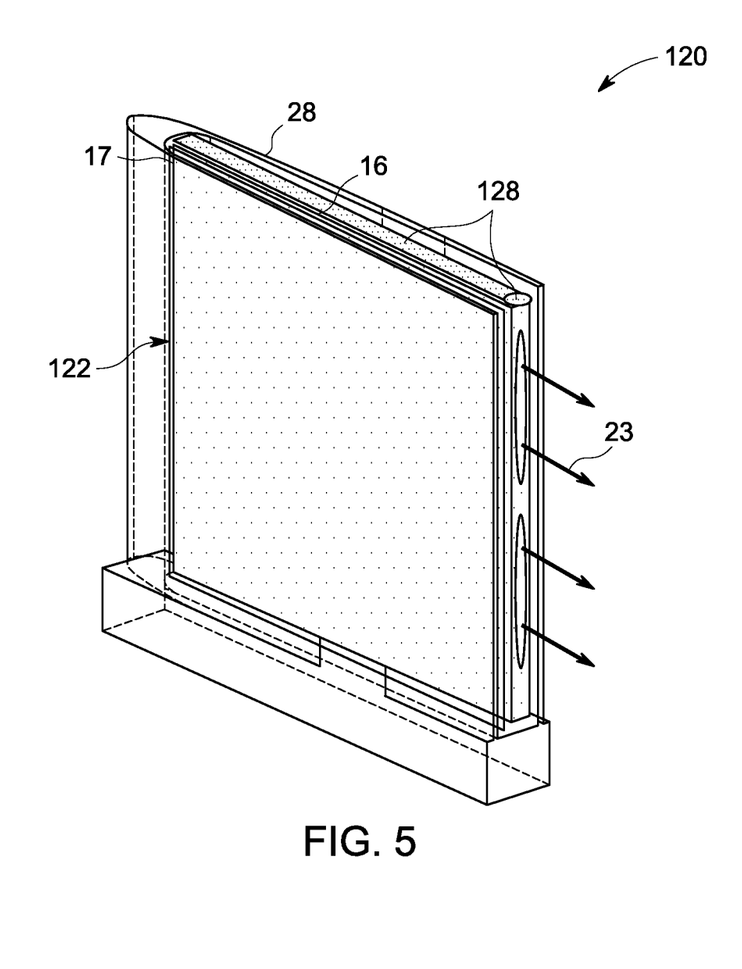
FIG. 5 is a cross-sectional view of an exemplary synthetic jet thermal management system including a sheet of non-conductive tape in accordance with an embodiment of the invention.

FIG. 5 is a cross-sectional view of a thermal management system 120 including sheet 122 of non-conductive tape on a whole area of each surface 44 of the piezo disks 15, 17. The sheet 122 electrically separates the synthetic jet 16 from the fin 28 to avoid potential electric shorting of the jet 16 in contact with the metallic inner surface 27 of the fin 28. A non-limiting example of non-conductive tape is Kapton. Furthermore, a layer 128 of silicone is applied on a top opening 132 of the fin 28 to enclose synthetic jet 16 into the cavity of the fin 28. The layer 128 ensures secure coupling of the synthetic jet 16 with the fin 28. A smooth layer 128 also provides an aerodynamic surface for the air flow in the heatsink 24.

Figure 6:
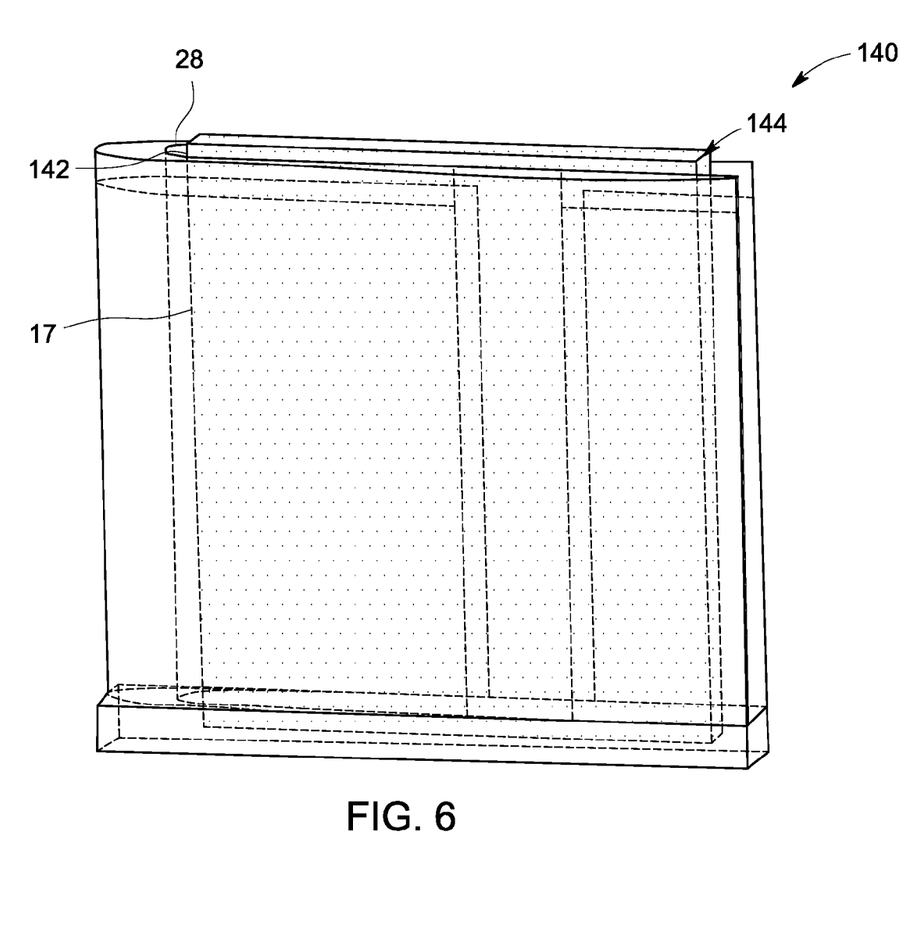
FIG. 6 is a cross-sectional view of an exemplary synthetic jet thermal management system including extrusions in accordance with an embodiment of the invention.

FIG. 6 is a cross-sectional view of a thermal management system 140 including extruded synthetic jets 142. The extrusions 144 of the synthetic jet 142 enable top and bottom surfaces of the synthetic jet 142 to fit into external support slots that ensure a rigid attachment with the fin 28. As illustrated herein, the piezo disks 15, 17 are elongated above and below (if needed) the slot into which it is fitted. For further robustness, a silicone material (not shown) may be introduced in the extrusion slot to hold the synthetic jet 16.

Figure 7:
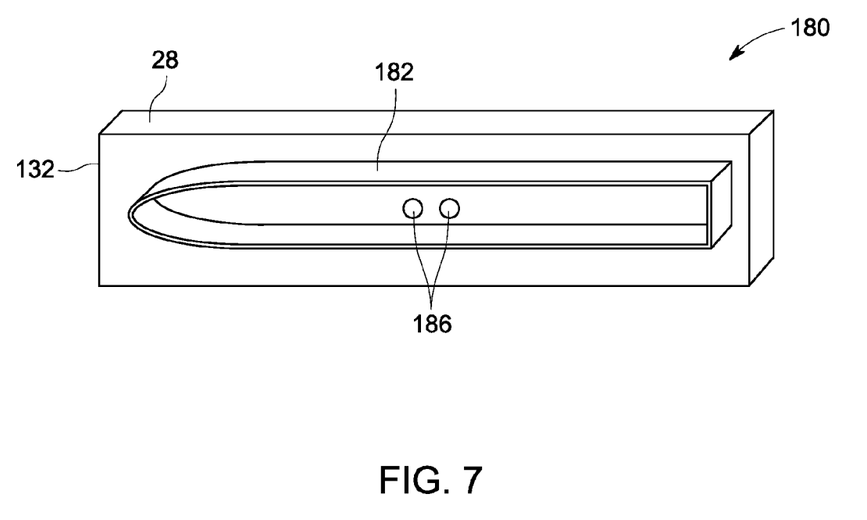
FIG. 7 is a top view of an exemplary synthetic jet thermal management system including a fin cap in accordance with an embodiment of the invention.

FIG. 7 is a top view of a thermal management system 180 including a fin cap 182. The fin cap 182 is disposed on a top opening 132 of the fin 28. The fin cap 182 is designed such that the synthetic jet 16 will be firmly enclosed within the fin 28, without being in contact with the cap. Through holes 186 may be formed in the fin cap 182 to facilitate a path for electrical connection of the synthetic jet 16. In the illustrated embodiment, the shape of the fin cap 182 is similar to cross-section of the fin with a concave end. In another embodiment, the shape may be similar to cross-section of the fin with a short extruded wall fitting end. In an embodiment, wherein there are multiple fins, a single fin cap may be employed for each fin, or a top plate including a number of caps may cover all the fins. In an exemplary embodiment, the fin cap 182 is adhesively coupled to the fin via a silicone or epoxy.

Figure 8:
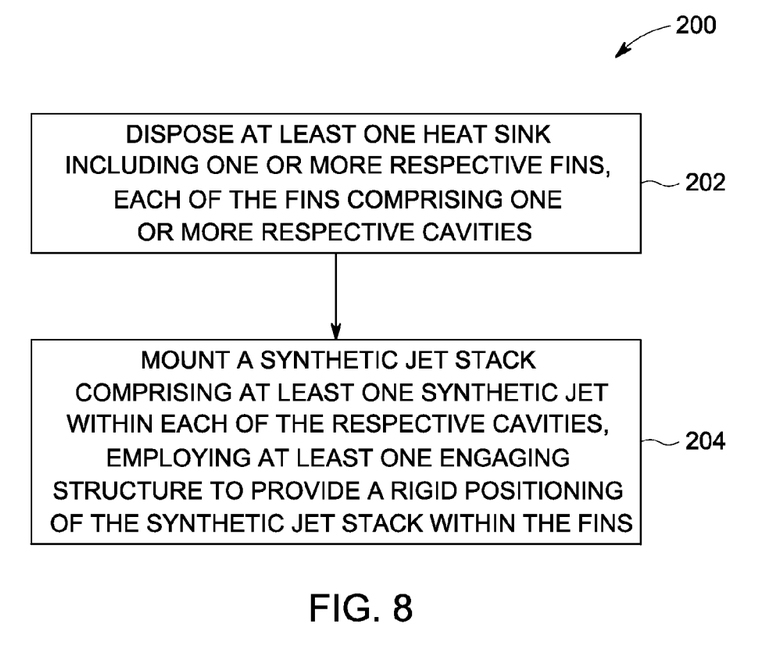
FIG. 8 is a flow chart representing steps in an exemplary method for manufacturing a synthetic jet thermal management system in accordance with an embodiment of the invention.

FIG. 8 is a flow chart representing steps in an exemplary method 200 for manufacturing a thermal management system. The method 200 includes disposing at least one heat sink including one or more respective fins, wherein each of the fins includes one or more respective cavities in step 202. A synthetic jet stack including at least one synthetic jet is mounted in the fin in step 204, employing at least one engaging structure to provide rigid positioning of the synthetic jet stack within the fins. The synthetic jet includes at least one orifice through which a fluid is ejected. In one embodiment, an engaging structure is employed by attaching an array of wires into each of the at least one synthetic jets to the respective one or more fins. In another embodiment, the engaging structure is employed by adhesively coupling a gasket to an outer surface of the at least one synthetic jet and an inner surface of the fins. In yet another embodiment, the engaging structure is employed by forming multiple bumps on an outer surface of the synthetic jet, and the multiple bumps are disposed upon multiple respective dimples embedded on the surface of the fins.

In another embodiment, the engaging structure is employed by disposing multiple locator pins on an outer surface of the synthetic jet, and the locator pins are fit into multiple respective holes drilled into the heat sink. In another embodiment, the engaging structure is employed by adhering a sheet of non-conductive tape to each outer surface of the synthetic jets, and a layer of silicone is applied at a top opening side of the fins to enclose the synthetic jets into the cavities. In yet another embodiment, the engaging structure is employed by forming extrusions in the synthetic jets, and the extrusions are fit into multiple external support slots on at least one of a top and a bottom surface of the fins, and a silicone adhesive is applied to the slots to ensure a rigid attachment. In another embodiment, the engaging structure is employed by disposing a fin cap on a top opening of each of the respective fins such that the synthetic jets are rigidly disposed within the fins, wherein the fin cap includes one or more holes to facilitate electrical connection to the synthetic jets. In yet another embodiment, the engaging structure is employed by disposing a top plate comprising multiple fin caps configured to cover each of the fins, such that the synthetic jets are rigidly disposed within the fins, the fin cap including one or more holes to facilitate electrical connection to the synthetic jets.

The various embodiments of a thermal management system and method described above thus provide a way to achieve a convenient and efficient means of packaging synthetic jet embedded fins. This technique also provides energy efficient cooling of electronic devices. Further, such systems may be employed with low power fans in electronics to provide the desirable high performance cooling.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

Furthermore, the skilled artisan will recognize the interchangeability of various features from different embodiments. Similarly, the various features described, as well as other known equivalents for each feature, can be mixed and matched by one of ordinary skill in this art to construct additional systems and techniques in accordance with principles of this disclosure.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A thermal management system comprising:
   at least one heat sink comprising one or more respective fins, at least one of the one or more fins comprising one or more respective cavities; and
   a synthetic jet stack comprising at least one synthetic jet inserted within each of the respective cavities of the fins employing at least one engaging structure to provide a rigid positioning of the synthetic jet stack within the fins, wherein the synthetic jet comprises at least one orifice through which a fluid is ejected, wherein the at least one engaging structure comprises a plurality of locater pins disposed on an outer surface of the synthetic jet, the locater pins fitted into a plurality of respective holes drilled into the heat sink forming a tight mechanical coupling between the synthetic jet and the fin.

2. The thermal management system of claim 1, wherein the at least one engaging structure comprises an array of wires attaching each of the at least one synthetic jets to the respective one or more fins.

3. The thermal management system of claim 1, wherein the at least one engaging structure comprises a gasket adhesively coupled to an outer surface of the at least one synthetic jet and an inner surface of the fins.

4. The thermal management system of claim 1, wherein the at least one engaging structure comprises a plurality of bumps formed on an outer surface of the synthetic jet, the plurality of bumps disposed upon a plurality of respective dimples embedded on the surface of the fins.

5. The thermal management system of claim 1, wherein the at least one engaging structure comprises:
   a sheet of non-conductive tape adhered to each outer surface of the synthetic jets; and
   a layer of silicone applied at a top opening side of the fins to enclose the synthetic jets into the cavities.

6. The thermal management system of claim 1, wherein the at least one engaging structure comprises:
   extrusions in the synthetic jets that fit into external support slots on at least one of a top and a bottom surface of the fins; and
   a silicone adhesive applied to the slots to ensure a rigid attachment.

7. The thermal management system of claim 1, wherein the at least one engaging structure comprises a fin cap disposed on a top opening of each of the respective fins such that the synthetic jets are rigidly disposed within the fins, the fin cap comprising one or more holes to facilitate electrical connection to the synthetic jets.

8. The thermal management system of claim 1, wherein the at least one engaging structure comprises a top plate comprising a plurality of fin caps configured to cover each of the fins, such that the synthetic jets are rigidly disposed within the fins, the fin cap comprising one or more holes to facilitate electrical connection to the synthetic jets.

9. A method for manufacturing a thermal management system, the method comprising:
   disposing at least one heat sink comprising one or more respective fins, each of the fins comprising one or more respective cavities; and
   inserting a synthetic jet stack comprising at least one synthetic jet within each of the respective cavities of the fins, employing at least one engaging structure to provide a rigid positioning of the synthetic jet stack within the fins, wherein the synthetic jet comprises at least one orifice through which a fluid is ejected, wherein employing the at least one engaging structure comprises:
   disposing a plurality of locater pins on an outer surface of the synthetic jet; and
   fitting the locater pins into a plurality of respective holes drilled into the heat sink forming a tight mechanical coupling between the synthetic jet and the fin.

10. The method of claim 9, wherein said employing the at least one engaging structure comprises attaching an array of wires into each of the at least one synthetic jets to the respective one or more fins.

11. The method of claim 9, wherein said employing the at least one engaging structure comprises adhesively coupling a gasket to an outer surface of the at least one synthetic jet and an inner surface of the fins.

12. The method of claim 9, wherein said employing the at least one engaging structure comprises:

forming a plurality of bumps on an outer surface of the synthetic jet; and disposing the plurality of bumps upon a plurality of respective dimples embedded on the surface of the fins.

13. The method of claim 9, wherein employing at least one engaging structure comprises:

adhering a sheet of non-conductive tape to each outer surface of the synthetic jets; and applying a layer of silicone at a top opening side of the fins to enclose the synthetic jets into the cavities.

14. The method of claim 9, wherein employing the at least one engaging structure comprises:

forming extrusions in the synthetic jets;

fitting said extrusions into a plurality of external support slots on at least one of a top and a bottom surface of the fins; and a silicone adhesive applied to the slots to ensure a rigid attachment.

15. The method of claim 9, wherein employing the at least one engaging structure comprises disposing a fin cap on a top opening of each of the respective fins such that the synthetic jets are rigidly disposed within the fins, the fin cap comprising one or more holes to facilitate electrical connection to the synthetic jets.

16. The method of claim 9, wherein employing the at least one engaging structure comprises disposing a top plate comprising a plurality of fin caps configured to cover each of the fins, such that the synthetic jets are rigidly disposed within the fins, the fin cap comprising one or more holes to facilitate electrical connection to the synthetic jets.

* * * * *